United States Patent [19]

Kagami et al.

[11] Patent Number: 5,258,282
[45] Date of Patent: Nov. 2, 1993

[54] DRY PROCESS, SILVER SALT PHOTOSENSITIVE MEMBER AND METHOD FOR FORMING IMAGE WITH THE DRY PROCESS, SILVER SALT PHOTOSENSITIVE MEMBER

[75] Inventors: Kenji Kagami, Atsugi; Masato Katayama, Yokohama; Tetsuro Fukui, Kawasaki; Hiromi Tanaka, Atsugi; Masao Suzuki, Tokyo, all of Japan

[73] Assignee: Canon Kabushiki Kaisha, Tokyo, Japan

[21] Appl. No.: 793,659

[22] Filed: Nov. 18, 1991

[30] Foreign Application Priority Data

Nov. 19, 1990 [JP]   Japan .................................. 2-311290

[51] Int. Cl.$^5$ .................... G03C 1/498; G03C 5/54
[52] U.S. Cl. ................... 430/619; 430/203; 430/217; 430/222; 430/273; 430/281; 430/576; 430/584; 430/588; 430/944
[58] Field of Search .............. 430/617, 203, 222, 964, 430/944, 212, 581, 619, 353, 576, 273, 584, 580, 217, 281

[56] References Cited

U.S. PATENT DOCUMENTS

| | | |
|---|---|---|
| 3,411,912 | 11/1968 | Dykstra et al. . |
| 3,549,605 | 12/1970 | Dykstra et al. . |
| 3,801,321 | 4/1974 | Evans et al. . |
| 4,536,473 | 8/1985 | Mihara ............................... 430/944 |
| 4,839,265 | 6/1989 | Ohno et al. ........................ 430/581 |
| 5,021,321 | 6/1991 | Fukui et al. ....................... 430/201 |

FOREIGN PATENT DOCUMENTS

| | | |
|---|---|---|
| 53-41067 | 10/1978 | Japan . |
| 54-5687 | 3/1979 | Japan . |
| 55-42375 | 10/1980 | Japan . |
| 57-138630 | 8/1982 | Japan . |
| 57-147627 | 9/1982 | Japan . |
| 58-107534 | 6/1983 | Japan . |
| 64-24245 | 1/1989 | Japan . |
| 64-8809 | 2/1989 | Japan . |

*Primary Examiner*—Charles L. Bowers, Jr.
*Assistant Examiner*—Thorl Chea
*Attorney, Agent, or Firm*—Fitzpatrick, Cella, Harper & Scinto

[57] ABSTRACT

A dry process silver salt photosensitive member is disclosed. The photosensitive member has a heat-developable photosensitive element containing at least (1) and organic silver salt, (2) a reducing agent, and (3) at least one of a photosensitive silver halide and a photosensitive silver halide-forming component on a support. The heat-developable photosensitive element further contains a compound represented by the general formula (I) and a compound represented by the general formula (II).

8 Claims, 1 Drawing Sheet

DRY PROCESS, SILVER SALT PHOTOSENSITIVE MEMBER AND METHOD FOR FORMING IMAGE WITH THE DRY PROCESS, SILVER SALT PHOTOSENSITIVE MEMBER

BACKGROUND OF THE INVENTION

1. Field of the Invention

This invention relates to a dry process, silver salt photosensitive member having a high sensitivity in a near infrared region and a high contrast and also to a method for forming an image with the dry process, silver salt photosensitive member.

2. Related Background Art

Silver halide photographic processes so far used are distinguished in the photosensitivity, gradation, etc., as compared with other photographic processes, but their treatments are complicated, because treatments such as fixation, bleaching, etc. must be carried out by wet process and also have disadvantages in the mechanization of the treatments. Many attempts to form an image by dry process in place of the silver halide photographic processes have been so far made.

A method for forming an image with a heat-developable, photosensitive material, whose development is carried out by heat treatment, has been proposed as a particularly distinguished method for forming an image by dry process, as compared with the conventional methods for forming an image. For example, Japanese Patent Publication No. 43-4924 discloses a heat-developable photosensitive material comprising an organic silver salt and silver halide in catalytic contact with organic silver ions. Similar photosensitive materials are also disclosed in Japanese Patent Publication No. 44-26582 and Japanese Patent Laid Open No. 46-6074.

Besides the foregoing methods, heat-developable photosensitive materials, which are heated before image exposure to activate the material into a photosensitive state, and again heated wholly, after the image exposure, to form a developed image, and a method for preparing these materials, where the heat-developable photosensitive materials comprise a heat-developable photosensitive member containing no silver halide or contain silver halide but having no photosensitivity at all, have been also proposed, for example, in Japanese Patent Publications Nos. 51-29829, 53-41067 and 54-5687.

The heat-developable photosensitive materials are used in the image communication field and medical fields and also as practical photosensitive materials as computer outputs, etc., with the advantage that the image formation is carried out by dry process treatments without any wet process step.

The heat-developable photosensitive materials have a high photosensitivity and an easy photosensitization to the visible region because silver halide is used as a photosensitive element, and thus have been also used in a recording system using a gas laser having a transmission wavelength in the visible region such as He-Ne laser, Ar ion laser, etc. as a beam source.

Recently, a semiconductor laser has been developed as a beam source of lower cost, smaller size and lighter weight with a highly efficient output, as compared with a gas laser source, and practically used in the fields of optical disks such as compact disks, laser printers, etc. Particularly, AlGaAs-based laser having a transmission wavelength of 780 nm has been widely used recently. Thus, systematizing the compact dry process image recording with higher performance and lower cost can be expected with such a laser beam source providing the advantages of lower cost, smaller size and lighter weight and such heat-developable photosensitive materials.

However, since a merocyanine sensitizing pigment is used in the heat-developable photosensitive materials, spectral sensitization to the near infrared region is hard to obtain, and thus it is inevitable to use said He-Ne laser or a visible light gas laser such as Ar ion laser. This is because the merocyanine pigments disclosed in Japanese Patent Publication No. 49-18808 become considerably unstable when the ethylene chain is extended to absorb light of long wavelength.

Cyanine pigments used in silver halide photosensitive materials for the ordinary wet process treatment have a low sensitizing efficiency in the dry process treatment and thus have been regarded as unsuitable for the dry process silver salt photosensitive member.

SUMMARY OF THE INVENTION

An object of the present invention is to provide a dry process silver salt photosensitive member for a compact, economical image recording system, which is photosensitive to a semiconductor laser having a transmission wavelength in the near infrared region and produces an image of distinguished sharpness and also to provide a method for forming an image with the dry process silver salt photosensitive member.

The dry process silver salt photosensitive member according to the present invention is a dry process silver salt photosensitive member, which comprises a heat-developable photosensitive element containing at least (1) an organic silver salt, (2) a reducing agent, and (3) at least one of a photosensitive silver halide and a photosensitive silver halide-formable component on a support, the heat-developable photosensitive element further containing a compound represented by the following general formula (I) and a compound represented by the following general formula (II):

wherein $R_1$ and $R_2$ each are a substituted or unsubstituted alkyl group; $R_3$, $R_4$, $R_5$ and $R_6$ each are a hydrogen atom, an alkyl group, an alkoxy group a halogen atom, a hydroxyl group, an aryl group, a carboxyl group, an alkoxycarbonyl group, a cyano group, a trifluoromethyl group, an amino group, an acylamido group, an acyl group, an acyloxy group, an alkoxycarbonylamino group, or a carboalkoxy group, where $R_3$ and $R_4$, and $R_5$ and $R_6$ may be linked to each other to form condensed rings, respectively; $X_1$ and $X_2$ each are an oxygen atom, a sulfur atom, or a selenium atom; $Y_1^\ominus$ is an anion; $r_1$ to $r_7$ each are a hydrogen atom or an alkyl group, where $r_1$ and $r_2$, $r_3$ and $r_4$, $r_2$ and $r_3$, $r_4$ and $r_5$, $r_5$ and $r_6$, and $r_6$ and $r_7$ may be linked to each other to form 5-membered or 6-membered rings, respectively; and m, n and l each are an integer of 0 to 3, but are not 0 at the same time, and (II)

wherein $A_7$, $A_8$, $A_9$ and $A_{10}$ each are an alkyl group; $A_1$ and $A_2$ each are a substituted or unsubstituted alkyl group or a hydrogen atom; $A_3$, $A_4$, $A_5$ and $A_6$ each are a hydrogen atom, an alkyl group, an alkoxy group, a halogen atom, a hydroxyl group, an aryl group, a carboxyl group, an alkoxycarbonyl group, a cyano group, a trifluoromethyl group, an amino group, an acylamido group, an acyl group, an acyloxyl group, an alkoxycarbonylamino group, or a carboalkoxy group, where $A_3$ and $A_4$, and $A_5$ and $A_6$ may be linked to each other to form condensed rings, respectively; $Y_2^\ominus$ is an anion; $a_1$ to $a_7$ each are a hydrogen atom or an alkyl group, where $a_1$ and $a_2$, $a_2$ and $a_3$, $a_3$ and $a_4$, $a_4$ and $a_5$, $a_5$ and $a_6$, and $a_6$ and $a_7$ may be linked to each other to form 5-membered or 6-membered rings, respectively; m, n, and l each are an integer of 0 to 3, but are not 0 at the same time.

The present method for forming an image comprises subjecting the dry process silver salt photosensitive member to image exposure and heat development.

DETAILED DESCRIPTION OF THE PREFERRED EMBODIMENTS

The heat-developable photosensitive element used in the present dry process silver salt photosensitive member contains at least (1) an organic silver salt, (2) a reducing agent and (3) a photosensitive silver halide and/or a photosensitive silver halide-formable component. All the individual components constituting the heat-developable photosensitive element can be contained in a single layer, or the organic silver salt and the reducing layer can be contained in another layer to form a multi-layer structure, or a layer containing the organic silver salt or the reducing agent can be further provided on the upper or lower surface of the single layer to form a multi-layer structure.

Furthermore, a polymerizable compound and a photopolymerization initiator can be contained in the heat-developable photosensitive element of the present invention. The polymerizable compound and the photopolymerization initiator may be contained in an another layer separated from the single layer to provide a multi-layer structure, or may be contained together in the single layer to form a monolayer structure. The heat-developable photosensitive element may also contain a heat-diffusible pigment. The heat-diffusible pigment may be contained in the layer containing the polymerizable compound and the photopolymerization initiator, or contained in another layer (pigment layer) separated from the layer containing the polymerizable compound and the photopolymerization initiator.

Organic silver salts having 12 to 24 carbon atoms are preferable since they hardly undergo troublesome changes such as coloration under room light, etc. and include, for example, silver behenate, silver stearate, silver palmitate, silver myristate, silver laurate, silver oleate and silver hydroxystearate. More preferable is silver behenate.

As the reducing agent, various compounds can be mentioned, and include, generally, developing agents used for the so far known silver halide photosensitive materials, such as hydroquinone, methylhydroquinone, chlorohydroquinone, methylhydroxynaphthalene, N,N'-diethyl-p-phenylenediamine, aminophenol, ascorbic acid, and 1-phenyl-3-pyrazolidone, and further include 2,2'-methylene-bis-(6-t-butyl-4-methylphenol), 4,4'-butylidene-bis-(6-t-butyl-3-methylphenol) and 4,4'-thiobis-(6-t-butyl-3-methylphenol), bisnaphthol-based, reducing compounds disclosed in Japanese Patent Application Laid-Open No. 46-6074, 4-benzenesulfoneamide-phenol-based compounds disclosed in Belgian Patent No. 802519, and compounds disclosed in Japanese Patent Applications Nos. 1-1153 and 1-259728.

The silver halide includes, for example, silver chloride, silver bromide, silver iodide, silver iodobromide, silver iodochloride, and silver iodochlorobromide. Silver halide, particularly in a fine granular state is effective, and can be prepared, for example, by halogenizing a portion of reduction-susceptible organic silver salt crystals with a silver halide-forming component, such as ammonium bromide, lithium bromide, sodium chloride, N-bromosuccinimide, etc. Content of silver halide or silver halide-forming component is preferably in a range of 0.001 to 0.50 mole, more preferably 0.01 to 0.30 mole per mole of the organic silver salt.

The present heat-developable photosensitive element may contain a binder, when required. The binder may be hydrophobic or hydrophilic, and transparent or semi-transparent, and includes, for example, polyvinylbutyral, cellulose acetate butyrate, polymethyl methacrylate, polyvinylpyrrolidone, ethylcellulose, cellulose acetate, polyvinyl acetate polyvinyl, alcohol, gelatin, and those containing repetition units of sulfobetaine disclosed in Canadian Patent No. 774054. The amount of the binder for use in the present invention is preferably in a ratio by weight of 10:1 to 1:10, more preferably 4:1 to 1:2 to the reduction-susceptible organic silver salt.

Furthermore, it is preferable to add a reduction aid playing a role of accelerating the oxidation-reduction reaction to the present heat-developable photosensitive element. The reduction aid includes, for example, cyclic imides such as uracil, N-hydroxynaphthalimide, phthal- imide and succinimide; cyclic hydrazides such as phthalic hydrazide and maleic hydrazide; and phthalazinediones, phthalazines and phthalazinones.

The present heat-developable photosensitive element contains a heptacyanine-based pigment of the following general formula (I) and an indolenine-based pigment of the following general formula (II) to improve the sensitization in the infrared region and the sharpness:

wherein $R_1$ and $R_2$ each are a substituted or unsubstituted alkyl group; $R_3$, $R_4$, $R_5$ and $R_6$ each are a hydrogen atom, an alkyl group, an alkoxy group, a halogen atom, a hydroxyl group, an aryl group, a carboxy group, an alkoxycarbonyl group, a cyano group, a trifluoromethyl group, an amino group, an acylamido group, an acyl group, an acyloxyl group, an alkoxycarbonylamino group, or a carboalkoxy group, where $R_3$ and $R_4$, and $R_5$ and $R_6$ may be linked to each other to form condensed rings respectively; $X_1$ and $X_2$ each are an oxygen atom, a sulfur atom, or a selenium atom; $Y^\ominus$ is an anion; $r_1$ to $r_7$ each are a hydrogen atom or an alkyl group, where $r_1$ and $r_2$, $r_3$ and $r_4$, $r_2$ and $r_3$, $r_4$ and $r_5$, $r_5$ and $r_6$, and $r_6$ and $r_7$ may be linked to each other to form 5-membered or 6-membered rings, respectively; and m, n and l each are an integer of 0 to 3, but are not 0 at the same time.

The hetero rings at both ends of the general formula (I), i.e.

are preferably a quinoline nucleus, a benzothiazole nucleus, a benzoxazole nucleus, a thiazole nucleus, a thiazoline nucleus, a benzoselenazole nucleus, an α-naphthothiazole nucleus, β-naphthothiazole nucleus, etc. and these two hetero rings may be the same or different. The hetero rings at both ends of the general formula (I) may be substituted with a lower alcohol group, a substituted or unsubstituted aryl group, a substituted or unsubstituted aralkyl group or a halogen atom.

Heptacyanine-based pigments of preferable structures will be given below, but are not limited thereto:

-continued

The general formula (II) of the indolenine-based pigment having an effect on irradiation prevention and sensitization is given below:

wherein $A_7$, $A_8$, $A_9$ and $A_{10}$ each are an alkyl group; $A_1$ and $A_2$ each are a substituted or unsubstituted alkyl group or a hydrogen atom; $A_3$, $A_4$, $A_5$ and $A_6$ each are a hydrogen atom, an alkyl group, an alkoxy group, a halogen atom, a hydroxyl group, an aryl group, a carboxyl group, an alkoxycarbonyl group, a cyano group, a trifluoromethyl group, an amino group, an acylamido group, an acyl group, an acyloxyl group, an alkoxycarbonylamino group or a carboalkoxy group, where $A_3$ and $A_4$, and $A_5$ and $A_6$ may be linked to each other to form condensed rings, respectively; $Y_2\ominus$ is an anion; $a_1$ to $a_7$ each are a hydrogen atom or an alkyl group, where $a_1$ and $a_2$, $a_2$ and $a_3$, $a_3$ and $a_4$, $a_4$ and $a_5$, $a_5$ and $a_6$, and $a_6$ and $a_7$ may be linked to each other to form 5-membered or 6-membered rings, respectively; m, n and l are an integer of 0 to 3, but are not 0 at the same time.

$Y_1\ominus$ and $Y_2\ominus$ are anions such as arylsulfonate ion, alkylsulfonate ion, alkoxysulfonate ion, halide ion, etc.

Indolenine-based pigments of preferable structures will be shown below, but are not limited thereto:

Procedure and timing for adding the heptacyanine-based pigment of the general formula (I) and the indolenine-based pigment of the general formula (II) to the heat-developable photosensitive element according to the present invention are not particularly limited. For example, a procedure for adding to a coating solution of the heat-developable photosensitive element the compound of the general formula (I) and the compound of the general formula (II) as dissolved in an appropriate solvent, separately or after mixing together, a procedure for applying a coating solution of the heat-developable photosensitive element to a support and dipping the surface of the heat-developable photosensitive element, after drying, into a solution containing the compound of the general formula (I) and/or the compound of the general formula (II), or a procedure for including the compound of the general formula (I) and the compound of the general formula (II) into a layer adjacent to the heat-developable photosensitive element can be used.

An appropriate amount of the compound of the general formula (I) to be added according to the present invention is in a range of $1\times10^{-5}$ to $1\times10^{-2}$ mole, preferably $1\times10^{-4}$ to $5\times10^{-3}$ mole, per mole of the reduction-susceptible organic silver salt.

An appropriate amount of the compound of the general formula (II) to be added according to the present invention is in a range of $5\times10^{-2}$ to $5\times10$ mole, preferably $1.0\times10^{-1}$ to $3.0\times10$ mole, per mole of the compound of the general formula (I).

When the compound of the general formula (II) is used above, the sensitization effect is hardly expected, though there is an irradiation-preventing effect, but when used together with the compound of the general formula (I), the sensitization effect can be obtained together with the irradiation-preventing effect.

In order to improve the tone of an image and the stability after the image formation, the present heat-developable photosensitive element may contain an organic acid, particularly the same or similar fatty acids as or to those of the long-chain fatty acid silver salts alone or together in their combination. An amount of the fatty acid to be used according to the present invention is 25 to 200% by mole, preferably 30 to 120% by mole on the basis of the reduction-susceptible organic silver salt.

Furthermore, the present heat-developable photosensitive element can contain an appropriate fogging-preventing agent. The fogging-preventing agent includes, for example, mercury compounds disclosed in Japanese Patent Publication No. 47-11113, 1, 2, 4-triazole compounds disclosed in Japanese Patent Publication No. 55-42375, tetrazole compounds disclosed in Japanese Patent Application Laid-Open No. 57-30828, benzoic acids disclosed in Japanese Patent Application Laid-Open No. 57-138630, sulfonylthio group-containing compounds disclosed in Japanese Patent Application Laid-Open No. 57-147627, and dibasic acids disclosed in Japanese Patent Application Laid-Open No. 58-107534. Particularly preferable fogging-preventing agent for use in the present invention is dibasic acids disclosed in Japanese Patent Application Laid-Open No. 58-107534. The dibasic acids are represented by the following general formula:

wherein R is a straight or branched alkylene group or alkenylene group having at least 4 carbon atoms.

In order to prevent coloring of non-image area by light, etc. after the image formation, the present heat-developable photosensitive element can contain a coloring-preventing agent. Preferable coloring-preventing agents are compounds disclosed in Japanese Patent Application Laid-Open No. 61-129642. The compounds are represented by the following general formula:

wherein $R_1$ is a substituted or unsubstituted alkyl group, a substituted or unsubstituted aryl group, or an alkoxy or aryloxy group; $R_2$ is a hydrogen atom, a substituted or unsubstituted alkyl group, or a substituted or unsubstituted aryl group; and X is a chlorine atom, a bromine atom or an iodine atom.

The present heat-developable photosensitive element can contain a development accelerating agent. Preferable development accelerating agent includes alkali metal salt compounds of fatty acids as disclosed in Japanese Patent Publication No. 64-8809.

The present heat-developable photosensitive element can contain an antistatic agent such as a fluorine-containing surfactant, or a combination of a fluorine-containing surfactant and a non-ionic surfactant disclosed in Japanese Patent Application Laid-Open No. 64-24245.

Furthermore, the present heat-developable photosensitive element can contain an ultraviolet absorbant, an optical whitening agent, a filter dye (layer), etc.

Support for use in the present invention includes films of synthetic resin such as polyethylene, polypropylene, polyethylene terephthalate, polycarbonate and cellulose acetate; papers such as synthetic paper, papers coated with films of synthetic resin such as polyethylene, art paper, photographic baryta paper, etc.; metallic plate (foil) of aluminum, etc.; and synthetic resin films or glass plates having a metal vapor deposition layer obtained by an ordinary procedure.

The present invention will be explained in detail below, referring to Examples, but the present invention is not limited thereto.

EXAMPLE 1

Preparation of Photosensitive Silver Halide 11.0 g of silver stearate was dispersed in 200 ml of ethanol under red safety light, and 7.5 g of polyvinyl butyral was added thereto. The mixture was stirred to obtain a dispersion. 50 ml of an acetone solution containing 5.5 g of N-bromosuccinimide and 6.4 mg of sodium bromide was dropwise added to the resulting suspension of silver stearate over one hour with stirring, while keeping the suspension at 50° C. After the dropwise addition, the dispersion was further stirred at 50° C. for one hour, and then cooled to room temperature to obtain a dispersion of silver bromide. Then, the dispersion of silver bromide was dropwise added into 1,000 ml of vigorously stirred water, and the precipitates were recovered by filtration, and dried, whereby 19.7 g of a solid of silver bromide-polyvinylbutyral containing stearic acid (which will be hereinafter referred to as silver bromide solid) was obtained.

Preparation of Heat-developable Photosensitive Material

A photosensitive composition consisting of the following compounds was prepared under green safety light which cut off the light having a wavelength of 600 nm or higher:

| | |
|---|---|
| Silver behenate | 2.5 g |
| Solid of silver bromide | 0.4 g |
| Behenic acid | 0.7 g |
| 2,2'-methylene-bis-(6-t-butyl-4-methylphenol) | 1.5 g |
| Phthalazine | 0.4 g |
| Polyvinylbutyral (S-LEC BM-2, trademark of a product made by Sekisui Chemical Co., Ltd. Japan) | 2.0 g |
| Mercuric bromide (20% methanol solution) | 0.5 ml |
| Xylene/n-butanol (in ratio of 1/1 volume) | 50 ml |

The composition was dispersed by a homomixer, and then a DMF (N,N'-dimethylformamide) solution containing 3.0 mg of the following heptacyanine-based pigment and 9.0 mg of the following indolenine-based pigment was added thereto to prepare an emulsion:

Heptacyanine-based pigment:

-continued

Indolenine-based pigment:

The emulsion was applied to a 100 μm polyester film and dried to form a layer of heat-developable photosensitive element having a film thickness of 10 μm (in a dry state). Then, an aqueous polyvinyl alcohol solution was applied to the layer of heat-developable photosensitive element to a film thickness of 1 to 2 μm (in a dry state) as a protective layer, and dried to obtain a dry process silver salt photosensitive member (I) according to the present invention.

COMPARATIVE EXAMPLE 1

A dry process silver salt photosensitive member (II) was prepared in the same manner as in Example 1, except that no indolenine-based pigment was used.

COMPARATIVE EXAMPLE 2

A dry process silver salt photosensitive member (III) was prepared in the same manner as in Example 2, except that no heptacyanine-based pigment was used.

Determination of Characteristics Curves

A step tablet of wet process silver salt film of transmission type (780 nm transmission: 0.04 to 90%; 15 steps) was placed on each of the thus obtained dry process silver salt photosensitive members (I), (II) and (III), and substantially the entire area of the step tablet was uniformly irradiated by the following light exposure unit:

| Laser: | semiconductor laser |
|---|---|
| Wavelength: | 780 nm |
| Emission output: | 20 mW |
| Scanning system: | Polygon mirror, rotating beam, scan type |
| Spot size: | 60 × 80 μm |
| Image surface energy: | 250 μJ/cm² |
| Scan time: | 700 μs/dot |

Then, the individual photosensitive members were heated at 120° C. for 10 seconds and developed in a drum cover-type, heat developing unit. Optical density of the resulting grey scale images was measured by a densitometer made by Narumi K.K. Japan. By plotting multiplication products of image surface energy by transmissivity of each step on the abscissa and optical densities on the ordinate, a characteristic curve shown in FIG. 1 was obtained.

When the energy at such a point as to give an optical density of (fogging concentration +1.0) was defined as a sensitivity, the following sensitivity was obtained in Example 1 and Comparative Examples 1 and 2.

| | Sensitivity ($\mu J/cm^2$) |
|---|---|
| Photosensitive member (I) of Example 1 | 50 |
| Photosensitive member (II) of Comparative Example 1 | 250 |
| Photosensitive member (III) of Comparative Example 2 | Sensitivity was too low to give an optical density up to (fogging concentration +1.0). |

It can be seen from the foregoing that a combination of heptacyanine-based pigment and indolenine-based pigment of the present invention can give a high infrared sensitivity.

Determination of Sharpness and Contrast

Figure 1:
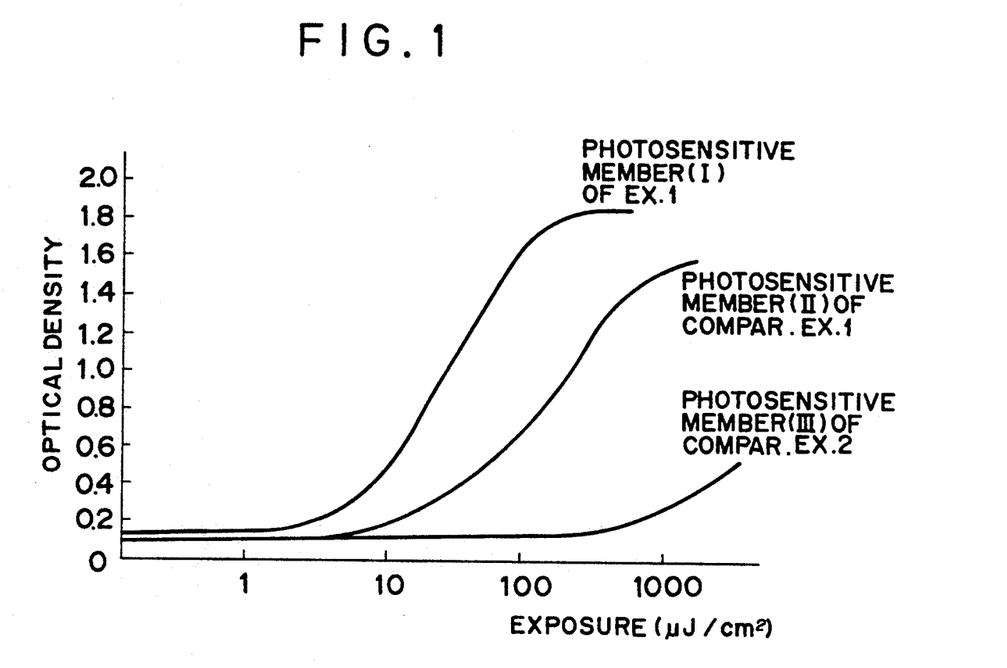
FIG. 1 is a diagram showing a relationship between irradiation energy applied to dry process silver salt photosensitive members of Example 1 and Comparative Examples 1 and 2, and optical density.

A resolution test pattern of lith film (line chart of 150, 300, 600 and 1200 DPI and 50% duty) was placed each on the photosensitive member (I) of Example 1 and the photosensitive member (II) of Comparative Example 1, and substantially the entire area of the resolution test pattern was uniformly irradiated at such a light exposure quantity as to give the maximum density from the characteristics curve of FIG. 1.

The individual photosensitive members were developed by heating at 120° C. for 10 seconds in a drum cover-type heat-developing unit. The thus obtained resolution patterns were subjected to measurement of optical density of pattern parts of black silver image (OD max) and optical density of white line parts (OD min) at the respective resolution degrees by Sakura microdensitometer PDM 5, and the measured OD values were converted to T % (transmissivity), and contrast was obtained according to the following equation:

$$\text{Contrast } (S/N \text{ ratio}) = \frac{T\text{min} - T\text{max}}{T\text{min} + T\text{max}} \times 100$$

Figure 2:
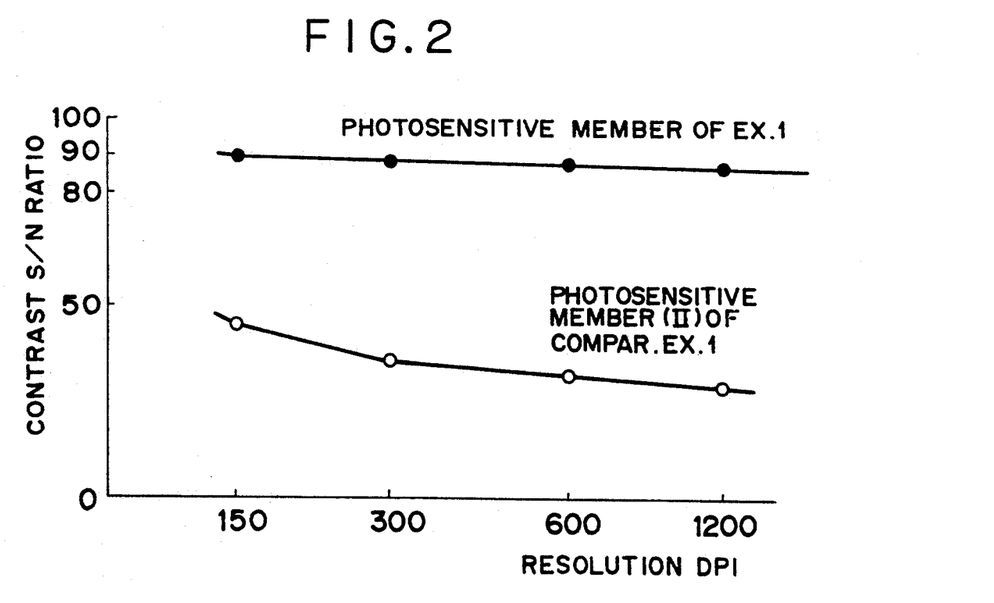
FIG. 2 is a diagram showing a relationship between resolving degree of dry process silver salt photosensitive members of Example 1 and Comparative Example 1, and contrast.

The contrasts were obtained for the respective resolution degrees, and shown in FIG. 2. As is apparent from FIG. 2, a combination of heptacyanine-based pigment and indolenine-based pigment of the present invention can give a sharp image with a high resolution degree and a high contrast (S/N ratio).

EXAMPLE 2

Preparation of Heat-developable Photosensitive Material

| Silver behenate | 2.5 g |
|---|---|
| Silver bromide solid (the same as in Example 1) | 0.4 g |
| Behenic acid | 0.8 g |
| 4,4'-methylene-bis-(2,6-di-t-butylphenol) | 1.8 g |
| Phthalazinone | 0.45 g |
| Polyvinylbutyral (S-LEC BM-2, tradename of a product made by Sekisui Chemical Co., Ltd. Japan) | 2.5 g |
| Mercuric bromide (20% methanol solution) | 0.5 ml |
| xylene/n-butyl alcohol (in ratio of 6/4 by volume) | 60 ml |

The foregoing composition was dispersed in a homomixer to obtain a dispersion.

4.0 mg of the following heptacyanine-based pigment and 8.0 mg of the following indolenine-based pigment was dissolved in DMF and added to the dispersion to prepare an emulsion:

Heptacyanine-based pigment:

Indolenine-based pigment:

The emulsion was applied to one side of a polyester film having a film thickness of 12 μm and dried to obtain a layer of heat-developable photosensitive element having a thickness of 12 μm. Then, the following polymerizable composition was applied to the other side of the polyester film than the side on which the layer of heat-developable photosensitive element was provided, to a thickness of 3 μm (in a dry state) and dried, whereby a dry process silver salt photosensitive member (IV) of the present invention was obtained.

| | |
|---|---|
| Polyvinylbutyral (S-LEC BL-2, tradename of a product made by Sekisui Chemical Co., Ltd. Japan) | 2.0 g |
| Polymethyl methacrylate (Elvacite 2041, tradename of a product made by Du Pont) | 4.0 g |
| Kayarad DPHA | 2.0 g |
| Trimethylolpropane triacrylate | 2.0 g |
| Kayacure DETX | 0.6 g |
| Kayacure EPA | 0.6 g |
| Methylethylketone | 40 g |
| Xylene | 10 g |

COMPARATIVE EXAMPLE 3

A dry process silver salt photosensitive member (V) was prepared in the same manner as in Example 2 except that no indolenine-based pigment was contained.

The photosensitive members (IV) and (V) were each laminated on the layer of the polymerizable composition with a PET film having a film thickness of 50 μm.

Sensitivity curve was obtained for the photosensitive members (IV) and (V) in the same manner as in Example 1, except that absorbancy at 395 nm was plotted on the ordinate in place of the optical density:

| | Sensitivity |
|---|---|
| Photosensitive member (IV): | 20 μj/cm$^2$ |
| Photosensitive member (V): | 100 μJ/cm$^2$ |
| Photosensitive member (IV) | had a considerably high sensitivity. |

Then, in the same manner as in Example 1, a resolution test pattern was placed on the photosensitive members (IV) and (V), and substantially the entire area of the test pattern was uniformly irradiated by a semiconductor laser, and then the photosensitive members were heated and developed at 130° C. for 10 seconds in a drum cover-type, heat-developing unit.

Then, the photosensitive members (IV) and (V) were subjected to polymerization exposure of the entire surface, for 10 seconds with a fluorescent lamp having an emission peak of 390 nm from the side on which the layer of the heat-developable photosensitive element was provided, and then dipped in ethanol to effect etching, whereby a polymerization pattern was made appear.

The results are shown in the following Table.

TABLE

| Resolving power | 150 | 300 | 600 | 1200 |
|---|---|---|---|---|
| Example 2 Photosensitive member (IV) | ○ | ○ | ○ | ○ |
| Comp. Ex. 3 Photosensitive member (V) | ○ | ○ | Δ | X |

X: No pattern was obtained under any condition of entire surface exposure
Δ: Smaller line width
○: Good As is apparent from the Table, a combination of heptacyanine-based pigment and indolenine-based pigment can produce a dry process silver salt photosensitive member capable of forming an image with a high sensitivity and a high resolving power relative to a semiconductor laser beam.

As explained above, the present invention can be sensitized in an infrared region with a high sensitivity on account of a combined use of a heptacyanine-based, sensitizing pigment and irradiation-preventing indolenine-based pigment, and thus can produce a very sharp image. Thus, the present dry process silver salt photosensitive member can be applied to a compact system of high image quality and low cost using a semiconductor laser, etc. as a light exposure means.

What is claimed is:

1. A dry process silver salt photosensitive member, which comprises a heat-developable photosensitive element containing at least (1) an organic silver salt, (2) a reducing agent, and (3) at least one of a photosensitive silver halide and a photosensitive silver halide-forming component on a support, the heat-developable photosensitive element further containing a compound represented by the following general formula (I) and a compound represented by the following general formula (II):

(I)

wherein $R_1$ and $R_2$ each are a substituted or unsubstituted alkyl group; $R_3$, $R_4$, $R_5$ and $R_6$ each are a hydrogen atom, an alkyl group, an alkoxy group, a halogen atom, a hydroxyl group, an aryl group, a carboxyl group, an alkoxycarbonyl group, a cyano group, a trifluoromethyl group, an amino group, an acylamido group, an acyl group, an acyloxyl group, an alkoxycarbonylamino group, or a carboalkoxy group, where $R_3$ and $R_4$, and $R_5$ and $R_6$ may be linked to each other to form condensed rings respectively; $X_1$ and $X_2$ each are an oxygen atom, a sulfur atom, or a selenium atom; $Y_1^\ominus$ is an anion; $r_1$ to $r_7$ each are a hydrogen atom or an alkyl group, where $r_1$ and $r_2$, $r_3$ and $r_4$, $r_2$ and $r_3$, $r_4$ and $r_5$, $r_5$ and $r_6$, and $r_6$ and $r_7$ may be linked to each other to form 5-membered or 6-membered rings, respectively; and m, n and l each are an integer of 0 to 3, but are not 0 at the same time, and (II)

wherein $A_7$, $A_8$, $A_9$ and $A_{10}$ each are an alkyl group; $A_1$ and $A_2$ each are a substituted or unsubstituted alkyl group or a hydrogen atom; $A_3$, $A_4$, $A_5$ and $A_6$ each are a hydrogen atom, an alkyl group, an alkoxy group, a halogen atom, a hydroxyl group, an aryl group, an alkoxycarbonyl group, a cyano group, a trifluoromethyl group, an amino group, an acylamido group, an acyl group, an acyloxyl group, an alkoxycarbonylamino group, or a carboalkoxy group, where $A_3$ and $A_4$, and $A_5$ and $A_6$ may be linked to each other to form condensed rings, respectively; $Y_2^\ominus$ is an anion; $a_1$ to $a_7$ each are a hydrogen atom or an alkyl group, where $a_1$ and $a_2$, $a_2$ and $a_3$, $a_3$ and $a_4$, $a_4$ and $a_5$, and $a_6$, and $a_6$ and $a_7$ may be linked to each other to form 5-membered or 6-membered rings, respectively; m, n and l each are an integer of 0 to 3, but are not 0 at the same time.

2. A dry process silver salt photosensitive member according to claim 1, wherein the heat-developable photosensitive element further contains a polymerizable compound and a photopolymerization initiator.

3. A dry process silver salt photosensitive member according to claim 1, wherein a layer containing a polymerizable compound and a photopolymerization initiator is contained separately from the heat-developable photosensitive element.

4. A dry process silver salt photosensitive member according to claim 2, wherein the heat-developable photosensitive element further contains a heat-diffusible pigment.

5. A dry process silver salt photosensitive member according to claim 3, wherein the layer contains a heat-diffusible pigment.

6. A dry process silver salt photosensitive member according to claim 3, wherein a layer containing a heat-diffusible pigment is contained separately from the layer.

7. A method for forming an image which comprises subjecting the dry process silver salt photosensitive member of claim 1 to image light exposure and heat development.

8. A method according to claim 7, wherein the dry process silver salt photosensitive member is subjected to polymerization light exposure after the heat development.

* * * * *

UNITED STATES PATENT AND TRADEMARK OFFICE
CERTIFICATE OF CORRECTION

PATENT NO. : 5,258,282
DATED : November 2, 1993
INVENTOR(S) : KENJI KAGAMI, ET AL.

It is certified that error appears in the above-identified patent and that said Letters Patent is hereby corrected as shown below:

COLUMN 1

Line 35, "Laid Open" should read --Laid-Open--.

COLUMN 2

Line 61, "group a" should read --group, a--.

COLUMN 3

Line 16, "$Y_1^\ominus$" should read --$Y_2^\ominus$--.

COLUMN 4

Line 58, "acetate polyvinyl," should read --acetate, polyvinyl--.

COLUMN 5

Line 64, "alcohol" should read --alkyl--.

COLUMN 7

Line 32, "$Y_1^\ominus$" should read --$Y_2^\ominus$--.

COLUMN 9

Line 4, "hardly" should read --not--.

COLUMN 10

Line 44, "cut" should read --cuts--.

UNITED STATES PATENT AND TRADEMARK OFFICE
CERTIFICATE OF CORRECTION

PATENT NO. : 5,258,282
DATED : November 2, 1993
INVENTOR(S) : KENJI KAGAMI, ET AL.

It is certified that error appears in the above-identified patent and that said Letters Patent is hereby corrected as shown below:

COLUMN 13

Line 9, "⬡" should read --⬢--.

COLUMN 14

Line 9, "made" should read --made to--.

COLUMN 16

Line 7, "and $a_6$," should read --$a_5$ and $a_6$,--.

Signed and Sealed this

Nineteenth Day of April, 1994

Attest:

BRUCE LEHMAN

Attesting Officer

Commissioner of Patents and Trademarks